United States Patent [19]
Yamachika et al.

[11] Patent Number: 5,556,734
[45] Date of Patent: Sep. 17, 1996

[54] RADIATION SENSITIVE RESIN COMPOSITION COMPRISING COPOLYMER OF ISOPROPENYLPHENOL AND T-BUTYL(METH)ACRYLATE

[75] Inventors: Mikio Yamachika, Kuwana, Japan; Eiichi Kobayashi, Albany, Calif.; Toshiyuki Ota; Akira Tsuji, both of Yokkaichi, Japan

[73] Assignee: Japan Synthetic Rubber Co., Ltd., Tokyo, Japan

[21] Appl. No.: 363,269

[22] Filed: Dec. 23, 1994

[30] Foreign Application Priority Data

Dec. 24, 1993 [JP] Japan .................................. 5-345792
Oct. 7, 1994 [JP] Japan .................................. 6-268112

[51] Int. Cl.$^6$ .......................................... G03C 1/73
[52] U.S. Cl. .................... 430/270.1; 430/192; 430/910; 430/921
[58] Field of Search ................................ 430/270, 326, 430/192, 910, 921

[56] References Cited

U.S. PATENT DOCUMENTS

| | | |
|---|---|---|
| 4,491,628 | 1/1985 | Ito et al. . |
| 4,696,886 | 9/1987 | Hanabata et al. ........................ 430/192 |
| 4,752,552 | 6/1988 | Aoai . |
| 4,816,375 | 3/1989 | Aoai . |
| 4,857,435 | 8/1989 | Hopf et al. . |
| 5,059,513 | 10/1991 | Hopf et al. . |
| 5,322,650 | 6/1994 | Endo et al. . |

FOREIGN PATENT DOCUMENTS

| | | |
|---|---|---|
| 60-37549 | 2/1985 | Japan . |
| 60-52845 | 3/1985 | Japan . |
| 60-115932 | 6/1985 | Japan . |
| 63-250642 | 10/1988 | Japan . |
| 63-292128 | 11/1988 | Japan . |
| 1-293339 | 11/1989 | Japan . |
| 2-27660 | 6/1990 | Japan . |
| 3-44290 | 7/1991 | Japan . |
| 3-206548 | 9/1991 | Japan . |
| 4-39665 | 2/1992 | Japan . |
| 4-251259 | 9/1992 | Japan . |
| 5-113667 | 5/1993 | Japan . |
| 5-181279 | 7/1993 | Japan . |

OTHER PUBLICATIONS

Database WPI, Derwent Publications, AN–93–177961, JP–5–107757, Apr. 30, 1993.

*Primary Examiner*—George F. Lesmes
*Assistant Examiner*—Laura Weiner
*Attorney, Agent, or Firm*—Oblon, Spivak, McClelland, Maier & Neustadt, P.C.

[57] ABSTRACT

A radiation sensitive resin composition which comprises (A) a copolymer represented by the following general formula and (B) a radiation sensitive acid generator and, if necessary, (C) an alkali-soluble resin:

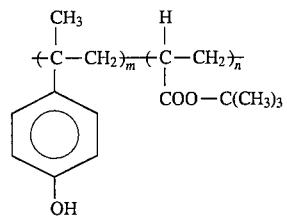

wherein R represents a hydrogen atom or a methyl group and m and n are integers representing the numbers of the respective recurring units and satisfying the relations $0.1 \geq m/(m+n) < 0.6$ and $0.4 < n/(m+n) \leq 0.9$. Said radiation sensitive resin composition is excellent in resolution and pattern profile and also excellent in sensitivity and developability and is useful as a chemically amplified resist good in contrast and heat resistance.

17 Claims, No Drawings

RADIATION SENSITIVE RESIN COMPOSITION COMPRISING COPOLYMER OF ISOPROPENYLPHENOL AND T-BUTYL(METH)ACRYLATE

BACKGROUND OF THE INVENTION

This invention relates to a radiation sensitive resin composition. More particularly, it relates to a radiation sensitive resin composition which is useful as a resist particularly suitable for fine processing using a radiation such as ultraviolet rays (e.g. UV), deep ultraviolet rays (e.g. deep UV), X rays or charged particle beams.

In the field of fine processing, a representative of which is the production of an integrated circuit device, the fining of the processing size in lithography is now proceeding quickly in order to obtain a higher integration degree of integrated circuit, and development of a lithographic processing which enables fine processing to be conducted stably with such a high precision that line widths of halfmicron or less are now pushed ahead. However, in a conventional method in which visible light (wavelength: 700–400 nm) or near ultraviolet light (wavelength: 400–300 nm) is used, it is difficult to form such a fine pattern with a high precision, and hence, there has been proposed a lithographic process which can achieve a wider depth of focus and uses a shorter radiation wavelength (wave-length: 300 nm or less) which is effective to the fining of design rule.

As a lithographic process using such short wavelength radiation, there has been proposed a process using deep UV such as KrF excimer laser (wavelength: 248 nm), ArF excimer laser (wavelength: 193 nm) or the like; X rays such as synchrotron radiation or the like; or charged particle beams such as electron beams or the like. As a high resolution resist corresponding to such a short wavelength radiation, a chemically amplified resist has been proposed by INTERNATIONAL BUSINESS MACHINES CORPORATION (IBM), and improvement and development of this chemically amplified resist are now being energetically developed.

In the case of such a chemically amplified resist, such a phenomenon that the radiation sensitive acid generator contained therein generates an acid upon irradiation with a radiation (the irradiation is referred to hereinafter as the exposure), and the catalytic action of this acid causes a chemical reaction in a resist coating film (for example, change of polarity, cleavage of chemical bond, crosslinking reaction or the like), whereby the solubility of the exposed portion in a developer is changed, is utilized to form a pattern.

As those chemically amplified resists which show relatively good resist performance, there are known, for example, those containing, as a resin component, an alkali-soluble resin having an alkali affinity group protected with a tert-butyl ester group or a tert-butoxycarbonyl group (for example, Japanese Patent Application Kokoku No. 2-27,660); an alkali-soluble resin having an alkali affinity group protected with a silyl group (for example, Japanese Patent Application Kokoku No. 3-44,290); a resin containing a (meth)acrylic acid component (for example, Japanese Patent Application Kokai No. 4-39,665), a mixture of such a resin with a phenolic novolak resin (for, example, Japanese Patent Application Kokai No. 63-250,642) and the like. However, it has been pointed out that these chemically amplified resists have respective inherent problems and various difficulties accompany putting the resists to practical use.

That is to say, in the system in which a resin having a tert-butyl ester group or a tert-butoxycarbonyl group is used, the chemical reaction based on the catalytic action of the acid generated upon the exposure is accompanied by the liberation of a gas component such as an isobutene gas or a carbon dioxide gas, so that volume shrinkage is caused in the exposed portion, and consequently, the pattern profile tends to be distorted and hence the formation of a high precision resist pattern is difficult. In the case of a resist in which a resin having a silyl group is used, the pattern profile is generally good; however, there is such a disadvantage that it is inferior in peelability from a substrate to a resist using a silyl group-free resist. In addition, where a (co)poly-(meth)acrylic acid as a resin is used, there is such a problem the adhesiveness between the resist and the substrate of silicon and the like is insufficient and the dry etching resistance is lower than that of a resist using an aromatic resin (for example, a phenol novolak resin or the like) as a constituent resin of resist.

In order to solve the above-mentioned problems in the chemically amplified resists, resins having both (meth-)acrylic acid ester unit and phenol skeleton have recently been proposed and attention is directed thereto (see, for example, Japanese Patent Application Kokai Nos. 4-251, 259; 5-181,279 and 5-113,667). However, in the case of these resists, the dry etching resistance is improved; however, a good rectangular pattern is difficult to obtain and there is a problem in respect of pattern profile. Moreover, said resists are insufficient in resolution, developability and the like and a further improvement of said resists is desired from the viewpoint of collective characteristics of chemically amplified resists.

SUMMARY OF THE INVENTION

This invention has been made as a result of extensive research on a resin component which is one of the constituents of a chemically amplified resin under such circumstances.

It is an object of this invention to provide a novel radiation sensitive resin composition which reacts effectively with various radiations such as ultraviolet rays, deep UV, X rays and charged particle beams.

It is another object of this invention to provide a radiation sensitive resin composition which does not cause volume shrinkage, peeling failure from the substrate and adherence failure to the substrate.

It is still another object of this invention is to provide a radiation sensitive resin composition useful as a chemically amplified resist which is excellent in resolution and pattern profile, also excellent in sensitivity and developability, and which has good contrast, heat resistance and the like.

Other objects and advantages of this invention will become apparent from the following description.

According to this invention, there is provided, firstly, a radiation sensitive resin composition (referred to hereinafter as the composition A) which comprises (A) a copolymer represented by the following general formula (1) and (B) a radiation sensitive acid generator (referred to hereinafter as merely the acid generator):

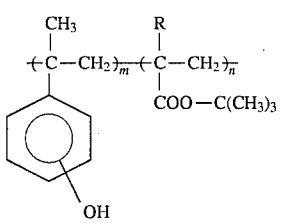

(1)

wherein R represents a hydrogen atom or a methyl group, m and n are integers representing the numbers of the respective repeating units and satisfying the relations $0.1 \leq m/(m+n) < 0.6$ and $0.4 < n/(m+n) \leq 0.9$.

According to this invention, there is secondly provided a radiation sensitive resin composition (referred to hereinafter as the composition B) which comprises (A) the above-mentioned copolymer, (B) the acid generator and (C) an alkali-soluble resin.

DETAILED DESCRIPTION OF THE INVENTION

Copolymer (A)

The polymer (A) used in the compositions A and B is a copolymer of an isopropenylphenol and tert-butyl (meth-)acrylate represented by the above-mentioned general formula (1).

In the copolymer (A), the isopropenyl group of the isopropenylphenol may be in the position of ortho, meta or para to the phenolic hydroxyl group; however, it is particularly preferable that it is in the para-position.

The copolymer (A) can be produced by copolymerizing at least one monomer selected from the group consisting of o-isopropenylphenol, m-isopropenylphenol and p-isopropenylphenol (referred to hereinafter collectively as the monomer a), preferably p-isopropenylphenol alone or in admixture with o-isopropenylphenol and/or m-isopropenylphenol, with tert-butyl acrylate and/or tert-butyl methacrylate (referred to hereinafter collectively as the monomer b).

The copolymer (A) may be a random copolymer, a block copolymer or a graft copolymer.

In the above copolymerization, various polymerization methods, for example, radical polymerization, anionic polymerization, living anionic polymerization and the like can be selected, and radical polymerization is particularly preferred. The above copolymerization can be carried out in a suitable polymerization manner such as bulk polymerization, solution polymerization, suspension polymerization, bulk-suspension polymerization, emulsion polymerization or the like; however, it is preferable to carry out the copolymerization in the radical polymerization manner in a good solvent for the copolymer (A) such as an acyclic (hydroxy)ether, a cyclic ether, an ester, a lactone, a ketone, an amide or the like.

The polymerization initiator which may be used in the above radical polymerization includes, for example, peroxides such as benzoyl peroxide, lauroyl peroxide and the like; azo compounds such as azobisisobutyronitrile, azobisovaleronitrile, azobisisocapronitrile and the like; redox catalysts composed of a peroxide and a reducing agent such as an amine, a mercaptan, a sulfinic acid, an α-hydroxycarbonyl compound, L-ascorbic acid, a hydrazine (derivative), a urea (derivative) or the like; etc.

In particular, in the above-mentioned radical polymerization, there may, if necessary, be added a chain transfer agent such as a halogenated hydrocarbon such as carbon tetrachloride, chloroform or the like; a mercaptan such as octylmercaptan, dodecylmercaptan, hexadecylmercaptan or the like; a xanthogendisulfide such as dimethylxanthogendisulfide, diethylxanthogendisulfide or the like; a thiuram sulfide such as tetramethylthiuram monosulfide, tetraethylthiuram disulfide or the like; a terpene such as dipentene, terpinolene or the like.

In the above-mentioned copolymerization, the polymerization temperature is suitably selected depending upon the kinds of the polymerization initiator, polymerization catalyst, polymerization solvent and the like and considering the molecular weight of the copolymer (A) produced, the polymerization reaction rate and the like.

The proportion of each monomer copolymerized in the copolymer (A) satisfies the relations $0.1 \leq m/(m+n) < 0.6$ and $0.4 < n/(m+n) \leq 0.9$, preferably the relations $0.3 \leq m/(m+n) < 0.6$ and $0.4 < n/(m+n) \leq 0.7$, and most preferably the relations $0.35 \leq m/(m+n) \leq 0.55$ and $0.45 \leq n/(m+n) \leq 0.65$, in the general formula (1). When $m/(m+n)$ is less than 0.1 and $n/(m+n)$ is more than 0.9, in this case, not only do the adhesiveness to the substrate and the solubility in an alkali developer become worse, but also the compatibility with the alkali-soluble resin used in the composition B becomes insufficient, so that the coatability as a resist is reduced. When $m/(m+n)$ is 0.6 or more and $n/(m+n)$ is 0.4 or less, the resolution as a resist becomes worse and the yield of the copolymer (A) tends to become lower.

In the compositions A and B, as far as the copolymer (A) satisfies the relations $0.1 \leq m/(m+n) < 0.6$ and $0.4 < n/(m+n) \leq 0.9$, a mixture of at least two copolymer components different in the proportions of the monomer a and monomer b copolymerized may be used. In this case, it is preferable that m and n of each copolymer component contained in the mixture satisfy at least the above-mentioned conditions.

Incidentally, in the above-mentioned copolymerization, it is preferable to remove an unreacted monomer to purify the copolymer until the total amount of the remaining unreacted monomers after the copolymerization becomes about 10% by weight or less, preferably about 3% by weight or less, of the copolymer (A) produced. Said removal and purification can be conducted by, for example, reduced pressure distillation, washing with a solvent or the like. When the total amount of the remaining unreacted monomers is more than about 10% by weight, the radiation-transmittance of the resist film formed from the compositions A or B becomes insufficient and the resolution has a tendency to become worse.

The polystyrene-reduced weight average molecular weight of the polymer (A) (referred to hereinafter as Mw) is preferably 3,000 to 60,000, more preferably 4,000 to 40,000 and most preferably 6,000 to 35,000 though it can be suitably selected taking into consideration the coatability of the compositions A and B and sensitivity, resolution, developability and heat resistance as a resist, and the like. When Mw is less than 3,000, the coatability of the compositions A and B and heat resistance and the like as a resist have a tendency to become worse, and when it exceeds 60,000, the sensitivity, resolution, developability and the like as a resist have a tendency to become worse.

Moreover, the ratio of the Mw of the copolymer (A) to the polystyrene-reduced number average molecular weight (referred to hereinafter as Mn) of the copolymer (A) (Mw/Mn) is preferably 1 to 5, more preferably 1.5 to 3.5 from the viewpoint of the sensitivity, resolution, developability, heat resistance and the like.

In the compositions A and B, as the copolymer component (A), there can be used a mixture consisting of at least two copolymer components different in Mw and/or Mw/Mn in the above-mentioned ranges. Even in such a case, it is preferable that the Mw falls within the range of 3,000 to 60,000 and the Mw/Mn falls within the range of 1 to 5.

Acid generator (B)

The acid generator (B) used in compositions A and B includes, for example, (1) onium salt compounds, (2) halogen-containing compounds, (3) sulfone compounds, (4) sulfonic acid ester compounds, (5) quinonediazide compounds and the like.

Specific examples of these acid generators (B) are mentioned below:

(1) Onium salt compound

As the onium salt compounds, there can be mentioned, for example, iodonium salts, sulfonium salts, phosphonium salts, diazonium salts, ammonium salts, pyridinium salts or the like.

Preferable onium salt compounds are diphenyliodonium triflate, diphenyliodonium pyrenesulfonate, diphenyliodonium dodecylbenzenesulfonate, triphenylsulfonium triflate, triphenylsulfonium hexafluoroantimonate, diphenyliodonium hexafluoroantimonate, triphenylsulfonium naphthalenesulfonate, (hydroxyphenyl)benzylmethylsulfonium toluenesulfonate and the like. Particularly preferable are triphenylsulfonium triflate, diphenyliodonium hexafluoroantimonate or the like.

(2) Halogen-containing compound

As the halogen-containing compounds, there can be mentioned haloalkyl group-containing hydrocarbon compounds, haloalkyl group-containing heterocyclic compounds or the like.

Preferable halogen-containing compounds are (poly)trichloromethyl-s,triazine derivatives such as phenyl-bis-(trichloromethyl)-s-triazine, methoxyphenyl-bis(trichloromethyl)-s-triazine, naphthyl-bis(trichloromethyl)-s-triazine or the like; 1,1-bis(4-chlorophenyl)-2,2,2-trichloroethane; and the like.

(3) Sulfone compound

As the sulfone compounds, there can be mentioned β-ketosulfone, β-sulfonylsulfone and their α-diazo compounds or the like.

Preferable sulfone compounds are, for example, phenacylphenylsulfone, mesitylphenacylsulfone, bis-(phenylsulfonyl)methane, bis(phenylsulfonyl)diazomethane, 4-trisphenacylsulfone or the like.

(4) Sulfonic acid ester compound

As the sulfonic acid ester compounds, there can be mentioned, for example, alkylsulfonic acid esters, haloalkylsulfonic acid esters, arylsulfonic acid esters, iminosulfonates, imidosulfonates or the like.

Among the preferable sulfonic acid ester compounds, other compounds than the imidosulfonates are, for example, benzoin tosylate, pyrogallol tristriflate, pyrogallol methanesulfonic acid triester, nitrobenzyl 9,10-diethoxyanthracene-2-sulfonate or the like. Particularly preferable is pyrogallol methanesulfonic acid triester.

Preferable imidosulfonate compounds are, for example, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)-bicyclo-[2.2.1]-hept-5-ene-2,3 -dicarboximide, N-(trifluoromethylsulfonyloxy)-7 -oxabicyclo-[2.2.1]-hept-5-ene-2,3-dicarboximide, N-(trifluoromethylsulfonyloxy)-bicyclo-[2.2.1]-heptan-5,6 -oxy-2,3-dicarboximide, N-(trifluoromethylsulfonyloxy)naphthylimide, N-(camphanylsulfonyloxy)succinimide, N-(camphanylsulfonyloxy)phthalimide, N-(camphanyl-sulfonyloxy)diphenylmaleimide, N-(camphanylsulfonyloxy)bicyclo-[2.2.1]-hept-5-ene-2,3-dicarboximide, N-(camphanylsulfonyloxy)-7-oxabicyclo-[2.2.1]-hept-5-ene-2,3-dicarboximide, N-(camphanylsulfonyloxy)-bicyclo[2.2.1]-heptan-5,6-oxy-2,3-dicarboximide, N-(camphanylsulfonyloxy)naphthylimide, N-(4-methyl-phenylsulfonyloxy)succinimide, N-(4-methylphenylsulfonyloxy)phthalimide, N-(4-methylphenylsulfonyloxy)diphenylmaleimide, N-(4-methylphenylsulfonyloxy)-bicyclo-[2.2.1]-hept-5-ene-2,3-dicarboximide, N-(4 -methylphenylsulfonyloxy)-7-oxabicyclo-[2.2.1]-hept-5 -ene-2,3-dicarboximide, N-(methylphenylsulfonyloxy)-bicyclo-[2.2.1]-heptan-5,6-oxy-2,3-dicarboximide, N-(4 -methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)-bicyclo-[2.2.1]-hept-5-ene-2,3-dicarboximide, N-(2-trifluoromethylphenylsulfonyloxy)-7-oxabicyclo-[2.2.1]-hept-5-ene-2,3-dicarboximide, N-(2-trifluoromethylphenylsulfonyloxy)-bicyclo-[2.2.1]-heptan-5,6-oxy-2,3-dicarboximide, N-(2 -trifluoromethylphenylsulfonyloxy)naphthylimide or the like.

(5) Quinonediazide compound

As the quinonediazide compounds, there can be mentioned, for example, 1,2-quinonediazidesulfonic acid esters of polyhydroxy compounds or the like.

Preferable quinonediazide compounds are compounds having a 1,2-quinonediazidesulfonyl group such as 1,2-benzoquinonediazide-4-sulfonyl group, 1,2-naphthoquinonediazide- 4-sulfonyl group, 1,2-naphthoquinonediazide-5-sulfonyl group, a 1,2-naphthoquinonediazide-6 -sulfonyl group or the like, and particularly preferable are compounds having a 1,2-naphthoquinonediazide-4 -sulfonyl group and/or a 1,2-naphthoquinonediazide-5 -sulfonyl group.

Specific examples of such quinonediazide compounds include 1,2-quinonediazidesulfonic acid esters of (poly)hydroxyphenylarylketones such as 2,3,4-trihydroxybenzophenone, 2,4,6-trihydroxybenzophenone, 2,3,4,4'-tetrahydroxybenzophenone, 2,2',3,4-tetrahydroxybenzophenone, 3'-methoxy-2,3,4,4'-tetrahydroxybenzophenone, 2,2',4,4'-tetrahydroxybenzophenone, 2,2',3,4,4'-pentahydroxybenzophenone, 2,2',3,4,6'-pentahydroxybenzophenone, 2,3,3',4,4',5'-hexahydroxybenzophenone, 2,3',4,4',5',6-hexahydroxybenzophenone and the like; 1,2-quinonediazidesulfonic acid esters of bis [(poly)hydroxyphenyl]alkanes such as bis(4-hydroxyphenyl)methane, bis(2,4-dihydroxyphenyl)methane, bis(2,3,4 -trihydroxyphenyl)methane, 2,2-bis(4-hydroxyphenyl)propane, 2,2-bis(2,4-dihydroxyphenyl)propane, 2,2-bis(2,3,4-trihydroxyphenyl)propane and the like; 1,2 -quinonediazidesulfonic acid esters of (poly)hydroxytriphenylalkanes such as 4,4'-dihydroxytriphenylmethane, 4,4',4"-trihydroxytriphenylmethane, 2,2',5,5'-tetramethyl-2",4,4'-trihydroxytriphenylmethane, 3,3',5,5'-tetramethyl-2",4,4'-trihydroxytriphenylmethane, 4,4',5,5'-tetramethyl-2,2',2"-trihydroxytriphenylmethane, 2,2',5,5'-tetramethyl-4,4',4"-trihydroxytriphenylmethane, 1,1,1-tris(4-hydroxyphenyl)ethane, 1,1-bis(4-hydroxyphenyl)-1-phenylethane, 1,1-bis(4 -hydroxyphenyl)-1-[4-{1-(4-hydroxyphenyl)-1-methylethyl}phenyl]ethane, 1,1,3-tris(2, 5-dimethyl-4-hydroxyphenyl)propane, 1,1,3-tris(2,5-dimethyl-4-hydroxyphenyl)butane, 1,3,3-tris(4-hydroxyphenyl)butane and the like; 1,2-quinonediazidesulfonic acid esters of (poly)hydroxyphenylflavans such as 2,4,4-trimethyl-2',4',7-trihydroxy-2-phenylflavan, 2,4,4-trimethyl-2',4',5',6,7-pentahydroxy-2-phenylflavan or the like; etc.

Particularly preferable are 1,2-naphthoquinonediazide-4-sulfonic acid ester compounds of 1,1-bis(4-hydroxyphenyl)-1-[4-{1-(4-hydroxyphenyl)-1-methylethyl}phenyl]ethanes represented by the following structural formula (2):

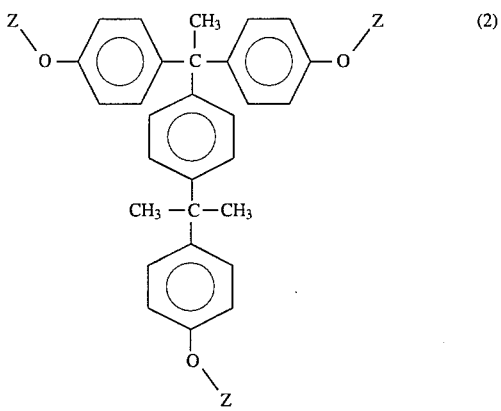

wherein Z represents a substituent of the formula (3):

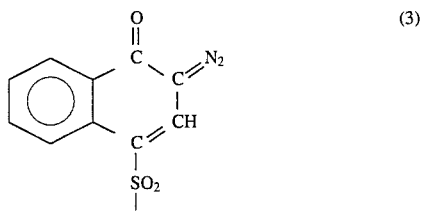

or a hydrogen atom.

In the structural formula (2), the proportion of Z being a substituent of the formula (3) is preferably 75 to 95% on average, particularly preferably 80 to 90% on average, and most preferably 85% on average.

In the compositions A and B, the acid generator (B) may be used alone or in admixture of two or more. The amount of the acid generator (B) used is preferably 0.05 to 20 parts by weight, more preferably 0.1 to 15 parts by weight, per 100 parts by weight of the copolymer (A), though it may be suitably selected depending upon the kind of acid generator used. When the amount of the acid generator (B) used is less than 0.05 part by weight, there is a fear that it may become difficult to cause the chemical reaction effectively with an acid catalyst generated by the exposure. On the other hand, when the amount of the acid generator is more than 20 parts by weight, there is a fear that uneven coating may be caused when the composition is applied to a substrate and scum or the like may be formed during development.

Alkali-soluble resin (C)

The alkali-soluble resin (C) used in the composition B is an alkali developer-soluble resin having a functional group exhibiting an affinity to the alkali developer, for example, at least one acidic functional group such as a phenolic hydroxyl group, a carboxyl group or the like. When such an alkali-soluble resin (C) is used, the control of the solubility of the resist film in the alkali developer becomes easy and as a result the developability can be further enhanced.

The alkali-soluble resin (C) is preferably, for example, a polyvinyl type resin having a recurring unit formed by cleavage of the polymerizable double bond of at least one acidic functional group-containing monomer such as hydroxystyrene, hydroxy-α-methylstyrene, vinyl benzoic acid, carboxymethylstyrene, carboxymethoxystyrene, (meth)acrylic acid, crotonic acid, maleic acid, fumaric acid, itaconic acid, citraconic acid, mesaconic acid, cinnamic acid or the like; a condensation resin having a condensation type recurring unit having an acidic functional group, a representative of which is a novolak resin; or the like.

When the alkali-soluble resin (C) is the polyvinyl type resin, this resin may be composed only of the recurring unit formed by cleavage of the polymerizable double bond of the above-mentioned acidic functional group-containing monomer; however, as far as the resin produced is soluble in an alkali developer, the resin may contain at least one other recurring unit.

Such other recurring units include, for example, recurring units formed by cleavage of the polymerizable double bond of a monomer having a polymerizable double bond such as styrene, α-methylstyrene, vinyltoluene, maleic anhydride, (meth)acrylonitrile, crotononitrile, maleronitrile, fumaronitrile, mesacononitrile, citracononitrile, itacononitrile, (meth)acrylamide, crotonamide, maleinamide, fumaramide, mesaconamide, citraconamide, itaconamide, vinylaniline, vinylpyridine, vinyl-ε-caprolactam, vinylpyrrolidone, vinylimidazole or the like.

Among these polyvinyl type resins, poly(hydroxystyrene) and hydroxystyrene-styrene copolymer are particularly preferred from the viewpoint that when a resist film is formed, the transmission of radiation is high and the dry etching resistance is excellent.

The alkali-soluble resin (C) composed of the above-mentioned polyvinyl type resins can be produced by (co)polymerizing, for example, at least one monomer having an acidic functional group, if necessary, with at least one other monomer. It can also be produced by (co)polymerizing a monomer having a protected acidic functional group, for example, hydroxystyrene whose phenolic hydroxyl group has been protected with a protective group such as tert-butyl group, acetyl group, tert-butoxycarbonyl group, trialkylsilyl group or the like, if necessary, together with other monomers and thereafter converting the protected group of the resulting (co)polymer into an acidic functional group by, for example, hydrolysis.

The above-mentioned (co)polymerization can be carried out by radical polymerization, thermal polymerization, ionic polymerization or the like in a polymerization manner such as bulk polymerization, solution polymerization, suspension polymerization, bulk-suspension polymerization, emulsion polymerization or the like depending upon the kinds or the like of the monomer and solvent.

Moreover, when the alkali-soluble resin (C) is the above-mentioned condensation resin, this resin may be composed only of the condensation type recurring unit containing an acidic functional group, or may have other recurring units as far as the resin produced is soluble in the alkali developer.

Such condensation resins can be produced by (co)polycondensing, for example, at least one phenol and at least one aldehyde, if necessary, together with other polycondensing components capable of forming condensation type recurring units, in the presence of an acidic catalyst in a water medium or a mixed medium of water and a hydrophilic solvent.

The above-mentioned phenols include, for example, o-cresol, m-cresol, p-cresol, 2,3-xylenol, 2,4-xylenol, 2,5-xylenol, 3,4-xylenol, 3,5-xylenol, 2,3,5-trimethylphenol, 3,4,5-trimethylphenol and the like, and the above-mentioned aldehydes include, for example, formaldehyde, trioxane, paraformaldehyde, benzaldehyde, acetaldehyde, propylaldehyde, phenylacetaldehyde or the like.

The content of the above-mentioned acidic functional group-containing recurring unit in the alkali-soluble resin (C) can be varied depending upon the kinds of said other recurring units optionally contained and hence cannot be uniquely defined; however, it is preferably 15 to 100mole %, more preferably 20 to 100 mole %.

In particular, the proportion of the monomers copolymerized in the hydroxystyrene-styrene copolymer is such that the number of the recurring units derived from styrene is preferably 100 or less, more preferably 30 to 5, per 100 recurring units derived from the hydroxystyrene. In this case, when the number of the recurring units derived from styrene exceeds 100, the resolution of the resist has a tendency to become worse.

The Mw of the alkali-soluble resin (C) can be varied depending upon the uses of the composition B and the desired characteristics and hence cannot be uniquely defined; however, it is preferably 1,000 to 150,000, more preferably 3,000 to 100,000.

In particular, when a poly(hydroxystyrene) is used as the alkali-soluble resin (C), its Mw is preferably 3,000 to 60,000, more preferably 4,000 to 30,000 in view of the compatibility with the copolymer (A) and the developability as a resist.

When a hydroxystyrene-styrene copolymer is used as the alkali-soluble resin (C), its Mw is preferably 2,000 to 50,000, more preferably 3,000 to 30,000 in view of the compatibility with the copolymer (A) and the developability as a resist.

When the alkali-soluble resin (C) has carbon-carbon unsaturations in the main chain and/or side chain, it can be hydrogenated and then used. In this case, the hydrogenation degree is preferably 90% or less, more preferably 70% or less and most preferably 50% or less, of the carbon-carbon unsaturations. When the hydrogenation degree of the hydrogenated product exceeds 90%, the solubility of the alkali-soluble resin (C) in the alkali developer has a tendency to become worse.

In the composition B, the alkali-soluble resins (C) can be used alone or in admixture of two or more, and the kinds and combinations thereof can be suitably selected depending upon the solubility of the copolymer (A) in the alkali developer, the alkali-developing conditions and the like.

The amount of the alkali-soluble resin (C) used in the composition B can be suitably selected depending upon the solubility of the copolymer (A) in the alkali developer, the alkali-developing conditions and the like; however, it is preferably 0.1 to 1,000 parts by weight, more preferably 0.5 to 500 parts by weight, per 100 parts by weight of the copolymer (A).

Particularly, when a poly(hydroxystyrene) is used as the alkali-soluble resin (C), the amount of the poly(hydroxystyrene) used is preferably 0.5 to 500 parts by weight, more preferably 1 to 300 parts by weight, per 100 parts by weight of the copolymer (A) though it may be varied depending upon the Mw of the poly(hydroxystyrene). When the amount of the poly(hydroxystyrene) used is less than 0.5 part by weight, the controlling effect on the solubility of the resist in the alkali developer becomes lower, and when it exceeds 500 parts by weight, the solubility of the resin in the alkali developer becomes too high and the resolution as a resist has a tendency to become worse.

When a hydroxystyrene-styrene copolymer is used as the alkali-soluble resin (C), the amount of the copolymer used is preferably 0.5 to 1,000 parts by weight, more preferably 1 to 300 parts by weight, per 100 parts by weight of the copolymer (A) though it may be varied depending upon the proportion of the hydroxystyrene and styrene copolymerized and Mw. When the amount of the hydroxystyrene-styrene copolymer used is less than 0.5 parts by weight, the control effect on the solubility of the resist in the alkali developer becomes lower and the developability may not always be sufficiently improved, and when it exceeds 1,000 parts by weight, the resolution as a resist has a tendency to become worse.

Acid-diffusion controller and dissolution controller

Into the compositions A and B may be compounded, if necessary, an acid-diffusion controller and/or a dissolution-controlling agent as explained below.

The above-mentioned acid-diffusion controller has such an action as to control the diffusion phenomenon in a resist film of the acid generated from the acid generator (B) by the exposure and suppress undesirable chemical reactions in the unexposed area. When such an acid-diffusion controller is used, the pattern profile, particularly the degree of formation of a visor in the upper part of the pattern, the dimension fidelity to mask dimension and the like can be further improved.

The above-mentioned acid-diffusion controllers are preferably nitrogen-containing organic compounds whose basicity is not changed by exposure or heating, and specific examples thereof include ammonia, hexylamine, heptylamine, octylamine, nonylamine, decylamine, dibutylamine, dipentylamine, dihexylamine, diheptylamine, dioctylamine, dinonylamine, didecylamine, trimethylamine, triethylamine, tripropylamine, tributylamine, tripentylamine, trihexylamine, triheptylamine, trioctylamine, trinonylamine, tridecylamine, aniline, N-methylaniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pyrrolidone, piperidine, imidazole, 4-methylimidazole, 4-methyl-2-phenylimidazole, thiabendazole, pyridine, 2-methylpyridine, 4-methylpyridine, 2-ethylpyridine, 4-ethylpyridine, 1-methyl-4-phenylpyridine, 2-(1-ethylpropyl)pyridine, nicotinamide, dibenzoylthiamine, riboflavin tetrabutyrate, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, dimethyl succinate-1-(2-hydroxyethyl)-4-hydroxy-2,2,6,6-tetramethylpiperidine polycondensate, poly[{6-(1,1,3,3-tetramethylbutyl)imino-1,3,5-triazine-2,4-diyl}{(2,2,6,6-tetramethyl-4-piperidyl)imino}hexamethylene{(2,2,6,6-tetramethyl-4-piperidyl)imino}], bis(1,2,2,6,6-pentamethyl-4-piperidyl)-2-(3,5-di-tert-butyl-4-hydroxybenzyl)-2-n-butylmalonate or the like.

These acid-diffusion controllers may be used alone or in admixture of two or more.

The proportion of the acid-diffusion controller compounded in the compositions A and B is preferably 0.001 to 10 parts by weight, more preferably 0.005 to 5 parts by weight, per 100 parts by weight of the copolymer (A). In this case, when the proportion of the acid-diffusion controller compounded exceeds 10 parts by weight, the sensitivity as a resist and the developability in the exposed portion have a tendency to lower and when the acid-diffusion controller is compounded in a proportion of 0.001 part by weight or more, it is possible to suppress particularly effectively the reduction of the pattern profile and dimension fidelity under some processing conditions.

The dissolution controller is a component which has such properties that the alkali-solubilities of the compositions A and B are controlled, and such an action that when it is decomposed in the presence of an acid, for example, is hydrolyzed, the alkali-dissolution-controlling effect of each of the compositions A and B is reduced or lost or the alkali-dissolution of each of the compositions A and B is accelerated.

As such a dissolution controller, there may be mentioned, for example, compounds in which the hydrogen atoms of the acidic functional groups such as phenolic hydroxyl group, carboxyl group and the like have been substituted by acid-decomposable groups which are decomposed in the presence of an acid, for example, hydrolyzed, and this may be either a low molecular weight compound or a high molecular weight compound.

Preferable low molecular weight dissolution controllers include, for example, compounds obtained by introducing an acid-decomposable group into the acidic functional group of a polyhydric phenol compound such as bisphenol A, bisphenol F, bisphenol S or the like and a carboxylic acid compound such as hydroxyphenylacetic acid [said compounds are referred to hereinafter as the dissolution controller (1)] or the like.

The high molecular weight dissolution controller include, for example, resins obtained by introducing the acid-decomposable group into the acidic functional group of an alkali-soluble resin such as the above-mentioned alkali-soluble resin (C) or the like [said resins are referred to hereinafter as the dissolution controller (2)] or the like.

The acid-decomposable groups in the dissolution controllers (1) and (2) include, for example, substituted methyl groups, 1-substituted ethyl groups, 1-branched alkyl groups, silyl groups, germyl groups, alkoxycarbonyl groups, acyl groups, cyclic acid-decomposable groups or the like.

The above-mentioned substituted methyl groups include, for example, methoxymethyl group, methylthiomethyl group, ethoxymethyl group, ethylthiomethyl group, methoxyethoxymethyl group, tert-butoxycarbonylmethyl group, benzyloxymethyl group, benzylthiomethyl group, phenacyl group, bromophenacyl group, methoxyphenacyl group, methylthiophenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group or the like.

The above-mentioned 1-substituted ethyl groups include, for example, 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, α-methylphenacyl group or the like.

The above-mentioned 1-branched alkyl groups include, for example, isopropyl group, sec-butyl group, tert-butyl group, 1,1-dimethylpropyl group, 1-methylbutyl group, 1,1-dimethylbutyl group or the like.

The above-mentioned silyl groups include, for example, trimethylsilyl group, dimethylethylsilyl group, methyldiethylsilyl group, triethylsilyl group, dimethylisopropylsilyl group, methyldiisopropylsilyl group, triisopropylsilyl group, dimethyl-tert-butylsilyl group, methyldi-tert-butylsilyl group, tri-tert-butylsilyl group, dimethylphenylsilyl group, methyldiphenylsilyl group, triphenylsilyl group or the like.

The above-mentioned germyl groups include, for example, trimethylgermyl group, dimethylethylgermyl group, methyldiethylgermyl group, triethylgermyl group, dimethylisopropylgermyl group, methyldiisopropylgermyl group, triisopropylgermyl group, dimethyl-tert-butylgermyl group, methyldi-tert-butylgermyl group, tri-tert-butylgermyl group, dimethylphenylgermyl group, methyldiphenylgermyl group, triphenylgermyl group or the like.

The above-mentioned alkoxycarbonyl groups include, for example, methoxycarbonyl group, ethoxycarbonyl group, isopropoxycarbonyl group, tert-butoxycarbonyl group, tert-pentyloxycarbonyl group or the like.

The above-mentioned acyl groups include, for example, acetyl group, propionyl group, butyryl group, heptanoyl group, hexanoyl group, valeryl group, pivaloyl group, isovaleryl group, lauloyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, camphoroyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group or the like.

The above-mentioned cyclic acid-decomposable groups include, for example, cyclopropyl group, cyclopentyl group, cyclohexyl group, cyclohexenyl group, oxocyclohexyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group, S,S-dioxide group, 2-1,3-dioxolanyl group, 2-1,3-dithioxolanyl group, benzo-2-1,3-dioxolanyl group, benzo-2-1,3-dithioxolanyl group or the like.

Among these acid-decomposable groups, preferable are tert-butyoxycarbonylmethyl group, benzyl group, tert-butyl group, tert-butoxycarbonyl group, tetrahydropyranyl group, tetrahydrofuranyl group, tetrahydrothiopyranyl group, tetrahydrothiofuranyl group, trimethylsilyl group or the like.

In particular, specific examples of the dissolution controller (1) include the compounds represented by the following formulas (4) to (6):

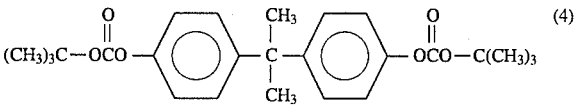

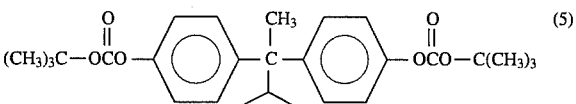

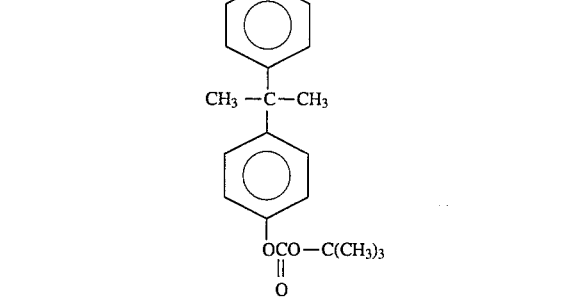

The dissolution controllers (1) and (2) can be produced, for example, by substituting at least one acid-decomposable group for the hydrogen atom or atoms of the acidic functional group in at least one low molecular weight or high molecular weight compound having at least one acidic functional group, and the dissolution controller (2) can be produced by (co)polymerizing at least one monomer having at least one acid-decomposable group or (co)polycondensing at least one polycondensing component having at least one acid-decomposable group.

Incidentally, the proportion of the acid-decomposable group introduced into the dissolution controller (2) [the ratio of the number of acid-decomposable groups to the total number of acidic functional groups and acid-decomposable groups in the dissolution controller (2)] is preferably 15 to 100%, more preferably 20 to 100% and most preferably 20 to 80%.

The Mw of the dissolution controller (2) is preferably 1,000 to 150,000, more preferably 3,000 to 100,000 though it may be varied depending upon the uses and the desired characteristics of the compositions A and B.

In the compositions A and B, the dissolution controllers may be used alone or in admixture of two or more. The amount of the dissolution controller compounded in these compositions is preferably 100 parts by weight or less, more preferably 50 parts by weight or less, per 100 parts by weight of the copolymer (A) though it may be varied depending upon the uses and the desired characteristics of the compositions A and B. When the amount of the dissolution controller compounded is more than 100 parts by weight, the film-formability of the composition, film strength and the like have a tendency to become worse.

Various additives

The compositions A and B may, if necessary, contain various additives such as a surfactant, a sensitizer or the like.

The above surfactant has an action to improve the coatability of the compositions A and B, striation, developability of resist and the like. Such surfactants include, for example, polyoxyethylene lauryl ether, polyoxyethylene stearyl ether, polyoxyethylene oleyl ether, polyoxyethylene octylphenyl ether, polyoxyethylene nonylphenyl ether, polyoxyethylene glycol dilaurate and polyoxyethylene glycol distearate and also include KP341 (a trade name of Shin-Etsu Chemical Co., Ltd.), Polyflow No. 75, No. 95 (trade names of Kyoeisha Yushi Kagaku Kogyo K. K.), EF Top EF-301, EF-303, EF-352 (trade names of TOHKEM PRODUCT Co.), Megafac F171, F172, F173 (trade names of DAINIPPON INK & CHEMICALS, INC.), Fluorad FC430, FC431 (trade names of Sumitomo 3M Limited), Asahi Guard AG710, SURFLON S-382, SC-101, SC-102, SC-103, SC-104, SC-105, SC-106 (trade names of Asahi Glass Co., Ltd.) or the like.

These surfactants may be used alone or in admixture of two or more. The amount of the surfactant compounded is preferably 2 parts by weight or less per 100 parts by weight of the solid content of the compositions A and B.

The above-mentioned sensitizer has an action to absorb the energy of radiation and transfer the energy to the acid generator (B) to thereby increase the amount of acid produced and has also an effect that the apparent sensitivity of resist obtained from the compositions A and B is enhanced. The sensitizer is preferably a ketone, a benzene, an acetophenone, a benzophenone, a naphthalene, a biacetyl, an eosin, rose bengal, a pyrene, an anthracene, a phenothiazine or the like.

These sensitizers may be used alone or in admixture of two or more. The amount of the sensitizer compounded is preferably 50 parts by weight or less, more preferably 30 parts by weight or less, per 100 parts by weight of the solid content of the compositions A and B.

By compounding a dye or a pigment with the composition, the latent image in the exposed portion is visualized, the influence of halation during the exposure can be moderated and by compounding an adhesion promoter with the composition, the adhesiveness to a substrate can be improved.

Moreover, other additives include halation-preventing agents such as 4-hydroxy-4'-methylchalcone and the like; storage stabilizers; defoaming agents; and the like.

The amount of each of these other additives compounded is preferably 50 parts by weight or less, more preferably 1 part by weight or less, per 100 parts by weight of the solid content in the composition A or B.

Solvent

The composition A or B is uniformly dissolved in a solvent so that the solid concentration becomes, for example, 5 to 50% by weight, preferably 20 to 40% by weight when it is used, and then filtered through a filter having a pore diameter, for example, about 0.2 μm to prepare a composition solution.

The solvent to be used in the preparation of the composition solution includes, for example, ethylene glycol monoalkyl ethers such as ethylene glycol monomethyl ether, ethylene glycol monoethyl ether, ethylene glycol monopropyl ether, ethylene glycol monobutyl ether and the like; ethylene glycol monoalkyl ether acetates such as ethylene glycol monomethyl ether acetate, ethylene glycol monoethyl ether acetate, ethylene glycol monopropyl ether acetate, ethylene glycol monobutyl ether acetate or the like; diethylene glycol dialkyl ethers such as diethylene glycol dimethyl ether, diethylene glycol diethyl ether, diethylene glycol dipropyl ether, diethylene glycol dibutyl ether or the like; propylene glycol monoalkyl ethers such as propylene glycol monomethyl ether, propylene glycol monoethyl ether, propylene glycol monopropyl ether, propylene glycol monobutyl ether or the like; propylene glycol dialkyl ethers such as propylene glycol dimethyl ether, propylene glycol diethyl ether, propylene glycol dipropyl ether, propylene glycol dibutyl ether or the like; propylene glycol monoalkyl ether acetates such as propylene glycol monomethyl ether acetate, propylene glycol monoethyl ether acetate, propylene glycol monopropyl ether acetate, propylene glycol monobutyl ether acetate or the like; lactic acid esters such as methyl lactate, ethyl lactate, n-propyl lactate, isopropyl lactate, n-butyl lactate, isobutyl lactate or the like; aliphatic carboxylic acid esters such as methyl formate, ethyl formate, n-propyl formate, isopropyl formate, n-butyl formate, isobutyl formate, n-amyl formate, isoamyl formate, methyl acetate, ethyl acetate, n-propyl acetate, isopropyl acetate, n-butyl acetate, isobutyl acetate, n-amyl acetate, isoamyl acetate, n-hexyl acetate, methyl propionate, ethyl propionate, n-propyl propionate, isopropyl propionate, n-butyl propionate, isobutyl propionate, methyl butyrate, ethyl butyrate, n-propyl butyrate, isopropyl butyrate, n-butyl butyrate, isobutyl butyrate or the like; other esters such as ethyl hydroxyacetate, ethyl 2-hydroxy-2-methylpropionate, methyl 3-methoxy-2-methylpropionate (methyl β-methoxybutyrate), methyl 2-hydroxy-3-methylbutyrate, ethyl methoxyacetate, ethyl ethoxyacetate, methyl 3 -methoxypropionate, ethyl 3-methoxypropionate, methyl 3 -ethoxypropionate, ethyl 3-ethoxypropionate, 3-methoxybutyl acetate, 3-methyl-3-methoxybutyl acetate, 3 -methyl-3-methoxybutyl propionate, 3-methyl-3-methoxybutyl butyrate, methyl acetoacetate, ethyl acetoacetate, methyl pyruvate, ethyl pyruvate or the like; aromatic hydrocarbons such as toluene, xylene or the like; ketones such as methyl ethyl ketone, methyl propyl ketone, methyl butyl ketone, 2-heptanone, 3-heptanone, 4-heptanone, cyclohexanone or the like; amides such as N-methylformamide, N,N-dimethylformamide, N-methylacetamide, N,N-dimethylacetamide, N-methylpyrrolidone or the like; lactones such as γ-butyrolactone or the like; etc.

These solvents may be used alone or in admixture of two or more. The amount of the solvent used is preferably 20 to 3,000 parts by weight, more preferably 50 to 3,000 parts by weight, and most preferably 100 to 2,000 parts by weight, per 100 parts by weight of the total solid content in the composition A or B.

Method of forming patterns

In the formation of a resist pattern from the composition A or B of this invention, each of the composition solutions prepared as mentioned above is applied to a substrate such as a silicon wafer, an aluminum-coated wafer or the like by an appropriate means such as a spin coating, a flow coating, a roll coating or the like to form a resist film, and the resulting resist film is, if necessary, previously subjected to heat-treatment (referred to hereinafter as the prebaking) and then to the exposure so that the desired pattern is formed. The radiation used in this case is appropriately selected from ultraviolet rays such as i-line (wavelength: 365 nm) or the like; deep UV rays such as ArF excimer laser (wavelength: 193 nm), KrF excimer laser (wavelength: 248 nm) or the like; X rays such as synchrotron radiation or the like; and charged particle beams such as electron beam or the like depending upon the kind of the acid generator (B). Conditions for the exposure such as exposure dose and the like are appropriately selected depending upon the compounding recipe of each composition, the kind of the additives and the like.

In this invention, in order to enhance the apparent sensitivity of the resist film, it is preferable to conduct heat-treatment after the exposure (referred to hereinafter as the post-exposure-baking). The conditions for said heat-treatment may be varied depending upon the compounding recipe of the composition A or B, the kind of each additive and the like; however, it is preferable to conduct the heat-treatment at a temperature of 30° to 200° C., more preferably 50° to 150° C.

In the formation of a resist pattern from the composition A or B, it is possible to provide a protective coating layer on the resist film for preventing the influence of basic impurities and the like contained in the ambient atmosphere.

Subsequently, the exposed resist is developed with an alkali developer to form the desired resist pattern.

As the above-mentioned alkali developer, there is used an alkaline aqueous solution prepared by dissolving in water an alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicyclo-[5.4.0]-7-undecene, 1,5-diazabicyclo-[4.3.0]-5-nonene or the like, so that the concentration becomes preferably 1 to 10% by weight, more preferably 2 to 5% by weight, used as the developer.

To the above alkali developer may be added an aqueous organic solvent such as methanol, ethanol or the like and a surfactant in appropriate amounts.

Incidentally, when a developer consisting of such an aqueous alkaline solution is used, the resulting resist pattern is washed with water after the development.

The radiation sensitive resin composition of this invention is excellent particularly in resolution and pattern profile, also excellent in sensitivity and developability and can form a fine pattern with high precision. In addition, the radiation sensitive resin composition of this invention reacts effectively with various radiations such as ultraviolet rays, deep UV, X rays and charged particle beams. Accordingly, the radiation sensitive resin composition of this invention can be very suitably used as a chemically amplified resist for producing a semiconductor device in which a further fining is inferred to proceed.

DESCRIPTION OF THE PREFERRED EMBODIMENTS

This invention is explained in more detail below referring to Examples and Comparative Examples; however, this invention should not be construed to be limited thereto.

Here, measurement of Mw and Mn (Mw/Mn) and evaluation of each resist were conducted as stated below.

Mw and Mn (Mw/Mn)

Measured, using GPC columns manufactured by TOSOH CORP. (two G2000H$_{XL}$ columns, one G3000H$_{XL}$ column and one G4000H$_{XL}$ column), by a gel permeation chromatograph method in which a monodisperse polystyrene was used as a standard under the analysis conditions that the flow rate was 1.0 ml/min, the eluent was tetrahydrofuran, and the column temperature was 40° C.

Sensitivity (e.g. photospeed)

A resist film formed on a silicon wafer was exposed, immediately thereafter, subjected to post-exposure-baking, subsequently developed with an alkali developer, washed with water and dried to form a resist pattern. At this time, the exposure dose in which a line-and-space pattern having a line width of 0.5 μm (1L1S) was formed in a 1:1 line width was taken as the optimum exposure dose, and the sensitivity was evaluated by this optimum exposure dose.

Resolution

The minimum dimension (μm) of the resist pattern resolved when the exposure was conducted at the optimum exposure dose was determined as the resolution.

Pattern profile

The lower side dimension La and the upper side dimension Lb of the square cross-section of the 1L1S pattern of a line width of 0.5 μm formed on a silicon wafer were measured using a scanning type electron microscope. When the resulting pattern satisfied $0.85 \leq Lb/La \leq 1$ and the pattern had no thinned portion in the vicinity of the substrate and neither visor nor thinned portion at the top, said pattern profile was determined as good. When patterns did not satisfy at least one of these conditions, they were determined as bad.

Yield of residual film thickness

The proportion (%) of the thickness of the resist pattern after the development to the thickness after the prebaking of the resist pattern was taken as the yield of residual film thickness, and the case where the value thereof was 97% or more the yield of residual film thickness is determined as good, the case where it was 90% or more but less than 97% as fair and the case where it was less than 90% as bad.

Production of the copolymer

Synthesis Example 1

In 131 g of propylene glycol monomethyl ether were dissolved 67 g (0.51 mole) of p-isopropenyphenol and 64 g (0.5 mole) of tert-butyl acrylate, and then 8 g of azobisisobutyronitrile was added thereto. Thereafter, the solution was kept at a reaction temperature of 60° C. under a nitrogen atmosphere to effect polymerization for 10 hours. After the polymerization, the reaction mixture was poured into five liters of hexane to coagulate the resulting copolymer and the coagulated copolymer was separated and then washed with five one-liter portions of hexane. The copolymer was thereafter dissolved in acetone again and then the resulting solution was poured into a large amount of water to coagulate the copolymer, thereby obtaining a white copolymer (yield: 56%).

This copolymer had Mw=12,400 and Mw/Mn=1.66. As a result of $^{13}$C-NMR analysis, it was found that the copolymerization ratio (mole ratio) of p-isopropenylphenol to tert-butyl acrylate was 50:50. This copolymer is referred to hereinafter as Copolymer (A-1).

Synthesis Example 2

The same procedure as in Synthesis Example 1 was repeated, except that 53 g (0.35 mole) of p-isopropenylphenol was substituted for the 67 g of p-isopropenylphenol and 92.2 g (0.65 mole) of tert-butyl acrylate was substituted for the 64 g of tert-butyl acrylate, to obtain a white copolymer (yield: 63%).

This copolymer had Mw=24,200 and Mw/Mn=1.84. As a result of $^{13}$C-NMR analysis, it was found that the copolymerization ratio (mole ratio) of p-isopropenylphenol to tert-butyl acrylate was 32:68. This polymer is referred to hereinafter as Copolymer (A-2).

Production of alkali-soluble resin (C)

Synthesis Example 3

In 33 g of dioxane were dissolved 300 g (1.7 moles) of p-tert-butoxystyrene, 30 g (0.3 mole) of styrene and 1.6 g of azobisisobutyronitrile, and thereafter, the solution was kept at a reaction temperature of 70° C. under a nitrogen atmosphere to effect polymerization for 12 hours. After the polymerization, the reaction mixture was poured into a large amount of methanol to coagulate the resulting resin, and the coagulated resin was dissolved in dioxane again, after which diluted sulfuric acid was added. The resulting mixture was subjected to hydrolysis at 90° C. for 10 hours to obtain an alkali-soluble resin (C) (yield: 82%).

This resin had Mw=18,000 and Mw/Mn=1.75 and the copolymerization ratio (mole ratio) of p-hydroxystyrene to styrene was 85:15. This resin is referred to hereinafter as Alkali-Soluble Resin (C-1).

Synthesis Example 4

In 300 g of dioxane were dissolved 300 g (1.7 moles) of p-tert-butoxystyrene and 1.6 g of azobisisobutyronitrile, and the resulting solution was kept at a reaction temperature of 60° C. under a nitrogen atmosphere to effect polymerization for 16 hours. Subsequently, in the same manner as in Synthesis Example 3, the reaction mixture was treated to an alkali-soluble resin (C) was obtained (yield: 80%).

This resin was poly(p-hydroxystyrene) having Mw=25,000 and Mw/Mn=1.54. This resin is referred to hereinafter as Alkali-Soluble Resin (C-2).

Synthesis Example 5

In 300 g of tetrahydrofuran were dissolved 52 g (0.5 mole) of styrene, 130 g (1.5 moles) of methacrylic acid and 1.6 g of azobisisobutyronitrile, and the resulting solution was kept at a reaction temperature of 60° C. under a nitrogen atmosphere to effect polymerization for 6 hours. After the polymerization, the reaction mixture was poured into a large amount of water to coagulate the resulting resin, and the coagulated resin was dissolved in acetone again, after which the resulting solution was coagulated in water again to obtain an alkali-soluble resin (C) (yield: 91%).

This resin had Mw=28,000 and Mw/Mn=2.31 and the copolymerization ratio (mole ratio) of styrene to methacrylic acid was 14:86. This resin is referred to hereinafter as Alkali-Soluble Resin (C-3).

Production of Dissolution Controller

Synthesis Example 6

In 100 g of tetrahydrofuran was dissolved 15 g of bisphenol A, and di-tert-butyl carbonate was added thereto in an amount 2 times the moles of total phenolic hydroxyl groups in the bisphenol A and triethylamine was added thereto in an amount 0.3 time the moles of total phenolic hydroxyl groups in the bisphenol A. Thereafter, the resulting solution was subjected to reaction for 6 hours under reflux. Subsequently, the reaction mixture was poured into water to precipitate the product, and this precipitate was dried in a vacuum drier at 50° C. overnight to obtain the dissolution controller (1) represented by the formula (4) (yield: 90%).

Synthesis Example 7

In 100 g of dioxane was dissolved 15 g of bisphenol A and hexamethyldisilazane was added thereto in an amount 2 times the moles of the total phenolic hydroxyl groups in the bisphenol A, after which the solution was subjected to reaction under reflux for 6 hours. Subsequently, the reaction mixture was poured into water to precipitate the product, and this precipitate was dried in a vacuum drier at 50° C. overnight to obtain the dissolution controller (1) represented by the formula (6) (yield: 98% ).

Production of Comparative Resin

Comparative Synthesis Example 1

In 50 ml of dioxane were dissolved 12 g of poly(p-hydroxystyrene) and 5 g of triethylamine. To this solution was added 11 g of di-tert-butyl carbonate while the solution was stirred, and then stirred at room temperature for a further 6 hours, after which oxalic acid was added to the solution to neutralize the triethylamine. Subsequently, the reaction mixture was poured into a large amount of water to coagulate the resulting resin and the coagulated resin was washed with pure water several times to obtain a white resin (yield: 85%).

The resin obtained had Mw=9,200 and Mw/Mn=2.8. As a result of $^{13}$C-NMR analysis, it was found that the resin had such a structure that 85% of the hydrogen atoms of the phenolic hydroxyl groups in the poly(p-vinylphenol) had been substituted by t-butoxycarbonyl groups. This resin is referred to hereinafter as Comparative Resin (α).

Comparative Synthesis Example 2

In 50 g of dioxane were dissolved 24 g of p-vinylphenol and 19 g of tert-butyl methacrylate, and thereafter, the solution was treated in the same manner as in Synthesis Example 1 to produce a white resin (yield: 65%).

The resin obtained had Mw=23,000 and Mw/Mn=2.3. As a result of $^{13}$C-NMR analysis, it was found that the copolymerization ratio (mole ratio) of p-vinylphenol to tert-butyl methacrylate was about 7:3. This resin is referred to hereinafter as Comparative Resin (β).

Examples 1 to 21 and Comparative Examples 1 to 4

The components shown in Tables 1 and 2 (provided that the part is by weight) were mixed to prepare a uniform solution, and thereafter, the solution was filtered through a membrane filter having a pore diameter of 0.2 μm to prepare a composition solution.

The composition solution was spin-coated on a silicon wafer and then prebaked under the conditions shown in Tables 3 and 4 to form a resist film having a film thickness of 1.0 μm, after which the resist film was subjected to the exposure and the post-exposure-baking under the conditions shown in Tables 3 and 4. Subsequently, the resist film was developed with 2.38% by weight aqueous tetramethylammonium hydroxide solution by a immersion method for 60 seconds at 23° C. to form a resist pattern. Each resist was then evaluated.

The evaluation results obtained are shown in Tables 5 and 6.

TABLE 1

| | Copolymer (A) or comparative resin (part) | | Acid generator (B) (part) | | Alkali-soluble resin (C) (part) | | Acid-diffusion controller (part) | Dissolution controller (part) | Solvent (part) | |
|---|---|---|---|---|---|---|---|---|---|---|
| Example 1 | A-1 | (100) | B-1 | (3) | — | | — | — | PGMEA | (350) |
| Example 2 | A-1 | (100) | B-2 | (4) | — | | — | Formula (4) (20) | EL | (400) |
| Example 3 | A-1 | (100) | B-1 | (3) | — | | — | Formula (6) (15) | MMP | (380) |
| Example 4 | A-1 | (100) | B-3 | (5) | C-1 | (5) | — | — | MMP | (370) |
| Example 5 | A-1 | (100) | B-1 | (3) | C-2 | (40) | — | — | PGMEA | (500) |
| Example 6 | A-1 | (100) | B-1 | (3) | C-2 | (45) | — | Formula (4) (3) | EL/EEP | (350/150) |
| Example 7 | A-2 | (100) | B-3 | (6) | C-2 | (100) | — | — | EEP | (700) |
| Example 8 | A-2 | (100) | B-1 | (3) | C-4 | (70) | — | — | MAK | (680) |
| Example 9 | A-2 | (100) | B-1 | (4) | C-3/C-4 | (5/50) | — | Formula (4) (3) | ECA | (600) |
| Example 10 | A-1/A-2 | (50/50) | B-2 | (3) | C-4 | (60) | — | — | PGMEA | (650) |
| Example 11 | A-1 | (100) | B-4 | (10) | C-1 | (10) | — | Formula (6) (2) | EL/BA | (350/150) |
| Example 12 | A-1 | (100) | B-2 | (5) | C-3 | (15) | — | Formula (6) (15) | EL | (430) |
| Example 13 | A-1 | (100) | B-5 | (5) | — | | — | — | EL | (400) |
| Example 14 | A-1 | (100) | B-1/B-5 | (3/2) | C-2 | (20) | — | — | PGMEA | (350) |
| Example 15 | A-1 | (100) | B-5/B-7 | (2/2) | C-3 | (20) | — | — | EL/BA | (350/150) |
| Example 16 | A-1/A-2 | (50/50) | B-6 | (3) | C-2 | (20) | — | — | EL/EEP | (350/150) |
| Example 17 | A-2 | (100) | B-1/B-5 | (3/2) | C-2 | (45) | — | Formula (4) (3) | EEP | (500) |
| Example 18 | A-1 | (100) | B-1 | (3) | — | | a (1.2) | — | PGMEA | (350) |
| Example 19 | A-1 | (100) | B-1 | (3) | C-2 | (45) | b (2.0) | Formula (4) (3) | EL/EEP | (350/150) |
| Example 20 | A-1 | (100) | B-1/B-5 | (3/2) | C-2 | (20) | c (1.2) | — | PGMEA | (350) |
| Example 21 | A-1/A-2 | (50/50) | B-6 | (3) | C-2 | (20) | d (1.5) | — | EL/EEP | (350/150) |

TABLE 2

| | Copolymer (A) or comparative resin (part) | Acid generator (B) part) | Alkali-soluble resin (C) (part) | Acid-diffusion controller (part) | Dissolution controller (part) | Solvent (part) |
|---|---|---|---|---|---|---|
| Comp. Example 1 | α (100) | B-1 (3) | — | — | — | PGMEA (350) |
| Comp. Example 2 | α (100) | B-1 (3) | C-1 (15) | — | — | PGMEA (350) |
| Comp. Example 3 | β (100) | B-1 (3) | — | — | — | PGMEA (350) |
| Comp. Example 4 | β (100) | B-2 (5) | C-2 (10) | — | (6) (15) | MMP (370) |

In Tables 1 and 2, the symbols used for the acid generator (B), the alkali-soluble resin (C) except for (C-1) to (C-3), the acid-diffusion controller and the solvent have the following meanings:

Acid generator (B)
(B-1): Triphenylsulfonium triflate
(B-2): Diphenyliodonium hexafluoroantimonate
(B-3): Pyrogallol methanesulfonic acid triester
(B-4): 1,2-Naphthoquinonediazide-4-sulfonic acid ester represented by the structural formula (2) (provided that 85% on average of Z is the substituent represented by formula (3) and 15% on average of Z is a hydrogen atom).
(B-5): N-(Trifluoromethylsulfonyloxy)-bicyclo-[2.2.1]-hept-5-ene-2,3-dicarboximide
(B-6): N-(Camphanylsulfonyloxy)naphthylimide
(B-7): N-(2-Trifluoromethylphenylsulfonyloxy)phthalimide
Alkali-soluble resin (C)
(C-4): Hydrogenated poly(hydroxystyrene) (PHM-C, a trade name of Maruzen Petrochemical Co., Ltd.)
Acid-diffusion controller (a): Tripropylamine
(b): Tri-n-butylamine
(c): Diaminodiphenylmethane
(d): Octylamine Solvent
BA: Butyl acetate
ECA: Ethylene glycol monoethyl ether acetate (ethyl Cellosolve acetate)
EEP: Ethyl 3-ethoxypropionate
EL: Ethyl lactate
MAK: Methyl amyl ketone
MMP: Methyl 3-methoxypropionate
PGMEA: Propylene glycol monomethyl ether acetate

TABLE 3

|  | Prebaking | | Radiation used in exposure (wavelength) | Post-exposure-baking | |
|---|---|---|---|---|---|
|  | Temp. (°C.) | Time (sec) |  | Temp. (°C.) | Time (sec) |
| Example 1 | 90 | 120 | KrF excimer laser (248 nm) | 90 | 120 |
| Example 2 | 110 | 120 | KrF excimer laser (248 nm) | 110 | 120 |
| Example 3 | 110 | 60 | KrF excimer laser (193 nm) | 110 | 120 |
| Example 4 | 90 | 120 | KrF excimer laser (248 nm) | 120 | 120 |
| Example 5 | 90 | 120 | KrF excimer laser (248 nm) | 90 | 120 |
| Example 6 | 140 | 120 | KrF excimer laser (248 nm) | 150 | 120 |
| Example 7 | 90 | 120 | KrF excimer laser (248 nm) | 90 | 120 |
| Example 8 | 90 | 120 | KrF excimer laser (248 nm) | 100 | 120 |
| Example 9 | 110 | 60 | KrF excimer laser (248 nm) | 110 | 90 |
| Example 10 | 100 | 90 | KrF excimer laser (247 nm) | 110 | 60 |
| Example 11 | 90 | 120 | i-line (365 nm) | 120 | 120 |
| Example 12 | 120 | 150 | Electron beam (beam dia. 0.25 μm) | 120 | 150 |
| Example 13 | 90 | 120 | KrF excimer laser (248 nm) | 90 | 120 |
| Example 14 | 110 | 120 | KrF excimer laser (248 nm) | 110 | 120 |
| Example 15 | 110 | 120 | KrF excimer laser (248 nm) | 110 | 120 |
| Example 16 | 140 | 120 | KrF excimer laser (248 nm) | 150 | 120 |
| Example 17 | 120 | 150 | Electron beam (beam dia. 0.25 μm) | 120 | 150 |
| Example 18 | 90 | 120 | KrF excimer laser (248 nm) | 90 | 120 |
| Example 19 | 140 | 120 | KrF excimer laser (248 nm) | 150 | 120 |
| Example 20 | 110 | 120 | KrF excimer laser (248 nm) | 110 | 120 |
| Example 21 | 140 | 120 | KrF excimer laser (248 nm) | 150 | 120 |

TABLE 4

|  | Prebaking | | Radiation used in exposure (wavelength) | Post-exposure-baking | |
|---|---|---|---|---|---|
|  | Temp. (°C.) | Time (sec) |  | Temp. (°C.) | Time (sec) |
| Comp. Example 1 | 90 | 120 | KrF excimer laser (248 μm) | 90 | 120 |
| Comp. Example 2 | 90 | 120 | KrF excimer laser (248 μm) | 110 | 120 |
| Comp. Example 3 | 90 | 120 | KrF excimer laser (248 μm) | 90 | 120 |
| Comp. Example 4 | 90 | 120 | KrF excimer laser (248 μm) | 110 | 120 |

TABLE 5

|  | Sensitivity | Resolution | Pattern profile | Yield of residual film thickness |
|---|---|---|---|---|
| Example 1 | 20 mJ/cm$^2$ | 0.24 μm | Good | 98% (Good) |
| Example 2 | 32 mJ/cm$^2$ | 0.26 μm | Good | 99% (Good) |
| Example 3 | 22 mJ/cm$^2$ | 0.26 μm | Good | 99% (Good) |
| Example 4 | 22 mJ/cm$^2$ | 0.26 μm | Good | 98% (Good) |
| Example 5 | 21 mJ/cm$^2$ | 0.24 μm | Good | 97% (Good) |
| Example 6 | 14 mJ/cm$^2$ | 0.24 μm | Good | 97% (Good) |
| Example 7 | 18 mJ/cm$^2$ | 0.24 μm | Good | 99% (Good) |
| Example 8 | 20 mJ/cm$^2$ | 0.24 μm | Good | 98% (Good) |
| Example 9 | 43 mJ/cm$^2$ | 0.24 μm | Good | 99% (Good) |
| Example 10 | 32 mJ/cm$^2$ | 0.26 μm | Good | 98% (Good) |
| Example 11 | 180 msec | 0.35 μm | Good | 98% (Good) |
| Example 12 | 2 μC/cm$^2$ | 0.26 μm | Good | 98% (Good) |
| Example 13 | 24 mJ/cm$^2$ | 0.24 μm | Good | 98% (Good) |
| Example 14 | 22 mJ/cm$^2$ | 0.26 μm | Good | 98% (Good) |
| Example 15 | 22 mJ/cm$^2$ | 0.26 μm | Good | 99% (Good) |
| Example 16 | 18 mJ/cm$^2$ | 0.24 μm | Good | 99% (Good) |
| Example 17 | 3 μC/cm$^2$ | 0.26 μm | Good | 99% (Good) |
| Example 18 | 24 mJ/cm$^2$ | 0.22 μm | Good | 98% (Good) |
| Example 19 | 18 mJ/cm$^2$ | 0.22 μm | Good | 97% (Good) |
| Example 20 | 26 mJ/cm$^2$ | 0.24 μm | Good | 98% (Good) |
| Example 21 | 22 mJ/cm$^2$ | 0.22 μm | Good | 99% (Good) |

TABLE 6

|  | Sensitivity | Resolution | Pattern profile | Yield of residual film thickness |
|---|---|---|---|---|
| Comp. Example 1 | 20 mJ/cm$^2$ | 0.30 μm | Bad (at Lb/La >1, overhang at top was remarkable) | 95% (Fair) |
| Comp. Example 2 | 15 mJ/cm$^2$ | 0.32 μm | Bad (at Lb/La >1, overhang at top was remarkable) | 92% (Fair) |
| Comp. Example 3 | 22 mJ/cm$^2$ | 0.28 μm | Bad (at Lb/La <0.85, top of pattern was thin) | 84% (Bad) |
| Comp. Example 4 | 24 mJ/cm$^2$ | 0.34 μm | Bad (at Lb/La <0.85, top of pattern was thin) | 76% (Bad) |

What is claimed is:

1. A radiation sensitive resin composition which comprises (A) a copolymer represented by the following general formula (1) and (B) a radiation sensitive acid generator:

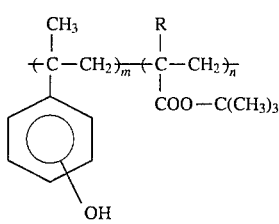

wherein R represents a hydrogen atom or a methyl group and m and n are integers representing the numbers of the respective recurring units and satisfying the relations $0.1 \leq m/(m+n) < 0.5$ and $0.5 < n/(m+n) \leq 0.9$.

2. The radiation sensitive resin composition according to claim 1, which further contains (C) an alkali-soluble resin.

3. The radiation sensitive resin composition according to claim 1, wherein the copolymer (A) represented by the general formula (1) is a copolymer of isopropenylphenol and tert-butyl acrylate.

4. The radiation sensitive resin composition according to claim 3, wherein the isopropenylphenol is p-isopropenylphenol.

5. The radiation sensitive resin composition according to claim 1, wherein the copolymer (A) represented by the general formula (1) is a random copolymer, a block copolymer or a graft copolymer.

6. The radiation sensitive resin composition according to claim 1, wherein m and n in the general formula (1) are integers satisfying the relations $0.3 \leq m/(m+n) < 0.5$ and $0.5 < n/(m+n) \leq 0.7$.

7. The radiation sensitive resin composition according to claim 1, wherein the polystyrene-reduced weight average molecular weight (Mw) of the copolymer (A) is 3,000 to 60,000.

8. The radiation sensitive resin composition according to claim 1, wherein the ratio of the polystyrene-reduced weight average molecular weight (Mw) of the copolymer (A) to the polystyrene-reduced number average molecular weight (Mn) of the copolymer (A) (Mw/Mn) is 1 to 5.

9. The radiation sensitive resin composition according to claim 1, wherein the radiation sensitive acid generator (B) is at least one compound selected from the group consisting of onium salt compounds, halogen-containing compounds, sulfone compounds, sulfonic acid ester compounds and quinonediazide compounds.

10. The radiation sensitive resin composition according to claim 1, wherein the amount of the radiation sensitive acid generator (B) contained is 0.05 to 20 parts by weight per 100 parts by weight of the copolymer (A).

11. The radiation sensitive resin composition according to claim 2, wherein the alkali-soluble resin (C) is a resin which has at least one acidic functional group and is soluble in an alkali developer.

12. The radiation sensitive resin composition according to claim 2, wherein the alkali-soluble resin (C) is a resin selected from the group consisting of polyvinyl type resins having an acidic functional group and condensation type resins having an acidic functional group.

13. The radiation sensitive resin composition according to claim 12, wherein the content of the recurring unit having an acidic functional group is 15 to 100 mole %.

14. The radiation sensitive resin composition according to claim 2, wherein the alkali-soluble resin (C) has a polystyrene-reduced weight average molecular weight (Mw) of 1,000 to 150,000.

15. The radiation sensitive resin composition according to claim 2, wherein the amount of the alkali-soluble resin (C) contained is 0.1 to 1,000 parts by weight per 100 parts by weight of the copolymer (A).

16. The radiation sensitive resin composition according to claim 1 or 2, which further contains an acid-diffusion controller which controls the diffusion of the acid generated from the radiation sensitive acid generator (B) by exposure in a resist film formed from the composition.

17. The radiation sensitive resin composition according to claim 1 or 2, which further contains a dissolution controller which controls the dissolution of the composition in an alkali developer.

* * * * *